Figure 1:
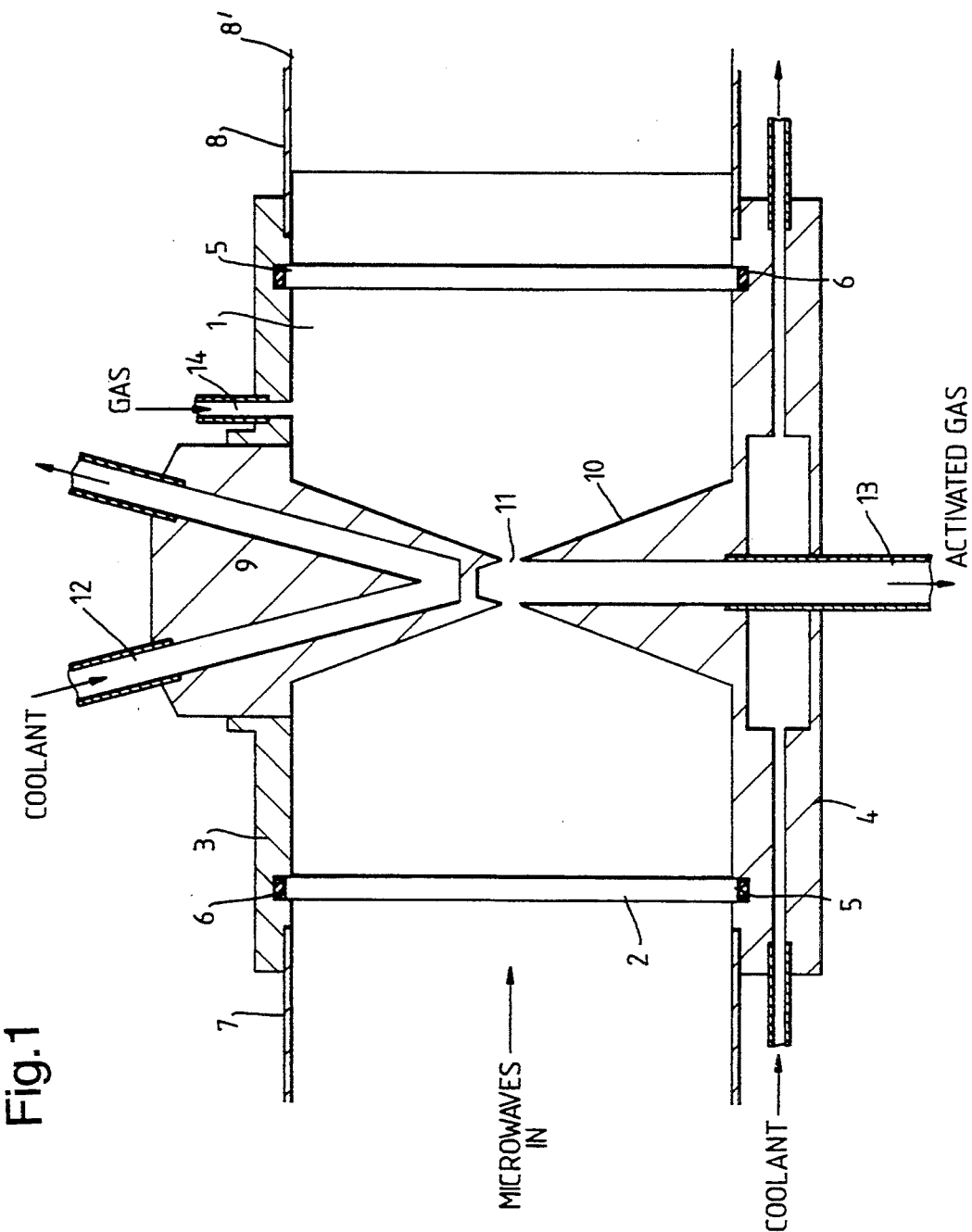

United States Patent [19]

Bayliss

[11] Patent Number: 5,418,430
[45] Date of Patent: May 23, 1995

[54] PLASMA GENERATOR WITH FIELD-ENHANCING ELECTRODES

[75] Inventor: Keith H. Bayliss, Bridgnorth, United Kingdom

[73] Assignee: United Kingdom Atomic Energy Authority, Harwell, United Kingdom

[21] Appl. No.: 148,573

[22] Filed: Nov. 8, 1993

[30] Foreign Application Priority Data

Nov. 26, 1992 [GB] United Kingdom ............... 9224745

[51] Int. Cl.⁶ ............................................. H01J 7/24
[52] U.S. Cl. ........................... 315/111.21; 315/111.81; 313/231.31
[58] Field of Search ............... 315/111.21, 111.81, 315/111.71, 111.31, 111.41, 111.01, 111.51, 111.91; 333/99 PL, 157; 313/231.31

[56] References Cited

U.S. PATENT DOCUMENTS

| 4,782,235 | 11/1988 | Lejeune et al. | 315/111.81 X |
| 4,866,346 | 9/1989 | Gaudreau et al. | 315/111.21 |
| 4,980,610 | 12/1990 | Varga | 315/111.21 |
| 5,270,616 | 12/1993 | Itatani | 315/111.21 |
| 5,276,386 | 1/1994 | Watanabe et al. | 315/111.21 |

Primary Examiner—Georgia Y. Epps
Assistant Examiner—Ali Neyzari
Attorney, Agent, or Firm—William R. Hinds

[57] ABSTRACT

A microwave plasma generator including a chamber within which there is a pair of opposed field-enhancing electrodes one of which has an axial hole through which gas which has been activated into a plasma state in the region between the electrodes can be extracted from the chamber.

9 Claims, 2 Drawing Sheets

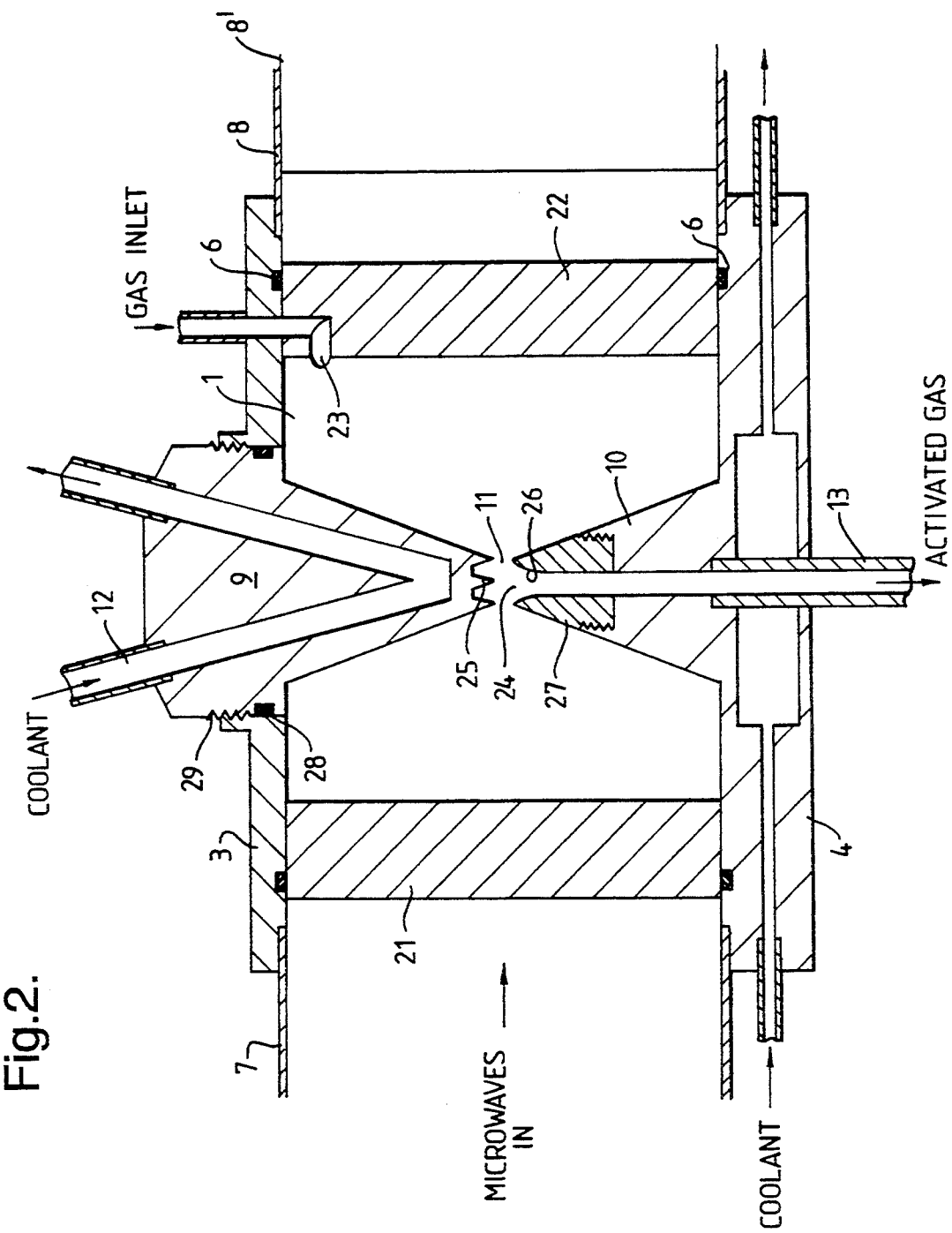

PLASMA GENERATOR WITH FIELD-ENHANCING ELECTRODES

The present invention relates to the generation of plasmas by means of microwave radiation.

The use of plasmas for materials processing is becoming increasingly important, but a limitation on their adoption is the relatively high electrical power inputs which are required to generate the plasma, and also the high temperature of the activated gases produced.

Existing microwave plasma generators couple microwave radiation uniformly into a chamber through which a process gas to be excited into a plasma state is caused to flow. The energy density therefore is low, unless high electrical power inputs are used, resulting in low electrical efficiencies.

It is an object of the present invention to provide a more efficient microwave plasma generator than hitherto.

According to the present invention there is provided a microwave plasma generator comprising a chamber adapted to be coupled to a waveguide system adapted to transmit electromagnetic radiation in the microwave region of the electromagnetic spectrum, an inlet port by means of which a process gas to be energised into a plasma state can be admitted to the chamber, and at least one pair of field-enhancing electrodes situated perpendicular to the direction of propagation of the microwave radiation through the chamber, at least one of the electrodes of a pair of electrodes having a passageway formed in it so that energised process gas can be extracted from the region of the chamber between the field-enhancing electrodes.

Preferably the electrodes are circular in cross-section and the passageway is an axial hole in the appropriate electrode.

In a preferred form, the electrodes are conical, one of them terminating in a sharp-edged rim, and the other having an axial hole of a diameter such that it too has a sharp-edged rim. The electrode without the axial hole may be provided with a pointed central projection.

The invention will now be described, by way of example, with reference to the accompanying drawings in which FIG. 1 is a longitudinal section of an embodiment of the invention, and FIG. 2 is a longitudinal section of another embodiment of the invention.

Referring to FIG. 1, a microwave plasma generator consists of a chamber 1 consisting of a glass cylinder 2 and two end-pieces 3 and 4, respectively. The glass cylinder 2 fits into annular grooves 5 machined into the end-pieces 3 and 4 of the chamber 1 and the chamber 1 is made to be gas-tight by means of O-rings 6. The assembly is held together by meads of clamps, which are not shown in the figure.

The end-pieces 3 and 4 of the chamber 1 are adapted to form part of waveguide sections 7 and 8, respectively, which are so dimensioned as to transmit microwave energy.

The waveguide section 7 is coupled to a microwave generator, which is not shown, and the waveguide section 8 includes a terminating short circuit, 8', which may be fixed, or capable of sliding within the section 8 of waveguide for tuning purposes.

Mounted in the end-pieces 3 and 4 of the chamber 1 is a pair of opposed field-enhancing electrodes 9 and 10, respectively.

The electrodes 9 and 10 are conical in form and terminate in sharp annular tips. The electrode 9 is adjustable to enable the gap 11 between the electrodes 9 and 10 to be varied. Suitable gaps are in the range 0.1 to 0.5 mm. The electrode 9 has a channel 12 formed in it by means of which a coolant can be passed through it. The electrode 10, which is integral with the end-piece 4 of the chamber 1 has an axial passageway 13 formed in it by means of which a process gas which has been energised into the plasma state in the gap 11 between the electrodes 9 and 10 can be withdrawn from the chamber 1. An inlet port 14 for the process gas passes through the end-piece 9 of the chamber 1.

The end-piece 4 of the chamber 1 is hollow so that a coolant can be passed through it. The end-pieces 3 and 4 of the chamber 1 and the electrodes 9 and 10 are made of stainless steel. They Can be made of other materials such as aluminium alloy with the sharp tips made of molybdenum or other refractory metal such as tungsten.

The annular shape Of the tips of the electrodes 9 and 10 has a number of effects. Firstly, the normal electric field enhancement which occurs when sharp points face each other. Secondly, in the geometry shown, there is a considerable pressure drop in the process gas as it flows through the small gap 11 between the electrodes 9 and 10 before entering the passageway 13 through the electrode 10. This not only makes it easier to excite the process gas to the plasma state in the gap 11 rather than elsewhere in the chamber 1 where the pressure of the process gas is higher, but the radial pressure gradient in the region of the tips confines the plasma to the region between the electrodes 9 and 10. Also, the geometry shown means that all the process gas on its passage through the gap 11 between the electrodes 9 and 10 passes at right angles through the region of maximum electric field, thus maximising the efficiency of the excitation of the process gas to the plasma state and so reducing the input power required to generate the plasma. The small volume of the discharge, which is surrounded by well cooled walls, means that the plasma temperature is kept relatively low, in spite of being energised by electrons which have been accelerated in the high electric fields. Furthermore, because the electric field distribution when the device is operating does not differ greatly from that which exists when no plasma is present, the device can be made to be self-starting.

Referring to FIG. 2, there is shown a representation of a second embodiment of the invention those components which are similar to corresponding components of the first embodiment have the same reference numerals.

In the embodiment 0f the invention shown in FIG. 2, the glass cylinder 5 is replaced by a block 21 made of glass-reinforced polytetrafluoroethylene although other inert, non-conducting materials can be used. The block 21 has a cylindrical inner surface 22 and a passage 23 which communicates with the gas inlet 14 at one end and is tangential to the inner surface 22 of the block 21 at the other. Thus gas emerging into the chamber 1 formed by the block 21 and the end-pieces 3 and 4 does so tangentially and spirals around the electrodes 9 and 10 before entering the gap 11 between the electrodes 9 and 10. This spiral flow pattern increases the stability of the electric discharge between the electrodes 9 and 10, so enabling electrode tips of larger diameter to be used, with a consequent increase in the throughput of activated gas. For example, a diameter 0.8 mm for the tip and orifice 24 of the passageway 13 in the electrode 10 and a gap 11 of 0.2 mm enables 100 shpm of gas to be activated. The discharge stability is increased further by means of a central projection 25 on the tip of electrode 9, and the flow of gas into the orifice 24 of the passageway 13 in the electrode 10 is enhanced by making the inner surface 26 of the orifice 24 trumpet-shaped.

The electrode 10 is provided with a replaceable tip 27 and an O-ring 28 is provided to ensure that there is no leakage of gas along the screw thread 29 which enables the position of the electrode 9 to be altered so as to enable the gap 11 between the electrodes 9 and 10 to be set at a desired value.

I claim

1. A microwave plasma generator comprising a chamber adapted to be coupled to a waveguide system adapted to transmit microwave electromagnetic radiation, an inlet port by means of which a process gas to be energised into a plasma state can be admitted to the chamber, and at least one pair of field-enhancing electrodes situated perpendicular to the direction of propagation of the microwave radiation through the chamber, at least one of the electrodes of the pair of field-enhancing electrodes having a passageway formed in it so that energised process gas can be extracted from the chamber via said passageway in one of the field-enhancing electrodes.

2. A microwave plasma generator according to claim 1 wherein the electrodes terminate in sharp-edged tips.

3. A microwave plasma generator according to claim 1 wherein the electrodes are conical in form.

4. A microwave plasma generator according to claim 2 wherein the tips are annular in form.

5. A microwave plasma generator according to claim 1 wherein the passageway is an axial hole in the appropriate electrode.

6. A microwave plasma generator according to claim 5 wherein the tip of the electrode of a pair of electrodes which does not have an axial hole has an axial pointed protrusion surrounded by a sharp-edged annulus.

7. A microwave plasma generator according to claim 1 wherein the axial separation between the electrodes can be varied.

8. A microwave plasma generator according to claim 1 wherein the inlet port is so positioned that the process gas is admitted to the chamber of the microwave plasma generator with a tangential component of velocity.

9. A microwave plasma generator according to claim 1 wherein there is a gap between the electrodes within the range 0.1 to 0.5 mm.

* * * * *